United States Patent [19]
Dick

[11] Patent Number: 5,977,827
[45] Date of Patent: Nov. 2, 1999

[54] CIRCUIT ARRANGEMENT INCLUDING A DIFFERENTIAL AMPLIFIER STAGE

[75] Inventor: Burkhard Dick, Hamburg, Germany

[73] Assignee: U.S. Philips Corporation, New York, N.Y.

[21] Appl. No.: 09/096,428

[22] Filed: Jun. 12, 1998

[30]       Foreign Application Priority Data

Jun. 14, 1997  [DE]   Germany ........................... 197 25 286

[51] Int. Cl.$^6$ ................................ H03F 3/45; H03F 3/68
[52] U.S. Cl. ............................................ 330/252; 330/295
[58] Field of Search .................................... 330/252, 261, 330/295

[56]                  References Cited

U.S. PATENT DOCUMENTS

| 3,444,473 | 5/1969 | Sherman | 330/252 |
| 4,904,952 | 2/1990 | Tanimoto | 330/252 |

OTHER PUBLICATIONS

"A Linearization Technique for Variable Transconductors Using Emitter Coupled Pairs and its Application to a 1–volt Active Filter", by Tanimoto et al., Proceedings of ESCCIRC 90, pp. 165–168.

"Halbleiter–Schaltungstechnik", by U. Tietze et al., 1978, pp. 58–67.

*Primary Examiner*—Benny Lee
*Assistant Examiner*—Patricia T. Nguyen
*Attorney, Agent, or Firm*—Steven R. Biren

[57]                  ABSTRACT

A circuit arrangement includes a first differential amplifier stage with two amplifier members whose main current paths are coupled to one another and, via a first reference current source, to a first reference potential, and are coupled to a respective output terminal as well as, via a respective output impedance, to a second reference potential, and whose control terminals can be supplied with a first control signal, an output signal being available at the output terminals. At least one further differential amplifier stage is provided, each of which includes two further amplifier members whose main current paths are coupled to one another and, via a respective further reference current source, to the first reference potential and whose control terminals can be supplied with (a) further control signal(s). Linearization of the transfer characteristic of the circuit arrangement can be achieved while avoiding a loss of gain in that the output impedances are preferably constructed as identical voltage dividers provided with a respective tapping for each further differential amplifier stage, the main current paths of the further differential amplifier stages are connected to each time two pair-wise mutually symmetrical tappings, providing a predetermined division, of the two voltage dividers, the ratio of the instantaneous values of the control signals to one another is predetermined, and the division of the tappings of the voltage dividers and the ratio of the currents supplied by the reference current sources are adjusted to one another in such a manner that output signal components which exhibit a dependency on at least one higher power of the control signals cancel out. This circuit arrangement also offers an improved noise factor.

5 Claims, 2 Drawing Sheets

CIRCUIT ARRANGEMENT INCLUDING A DIFFERENTIAL AMPLIFIER STAGE

BACKGROUND OF THE INVENTION

The invention relates to a circuit arrangement which includes a first differential amplifier stage with two amplifier members whose main current paths on the one hand are coupled to one another and, via a first reference current source, to a first reference potential, and on the other hand are coupled to a respective output terminal as well as, via a respective output impedance, to a second reference potential, and whose control terminals can be supplied with a first control signal, an output signal being available at the output terminals, at least one further differential amplifier stage, each of which includes two further amplifier members whose main current paths on the one hand are coupled to one another and, via a respective further reference current source, to the first reference potential and whose control terminals can be supplied with (a) further control signal(s).

Circuit arrangements integrated on a semiconductor body often utilize differential amplifier stages which include amplifier members which are preferably formed by means of bipolar transistors. Inputs of such differential amplifier stages are then formed by base terminals of the bipolar transistors. Furthermore, the emitter terminals of the transistors are connected either directly, in which case they constitute a non-stabilized feedback differential amplifier, or they are linearized by resistance negative feedback. In the latter case the linearization resistors are connected to the emitter terminals of the transistors as emitter resistors and are connected in series with the main current paths of the amplifier members. The magnitude of the negative feedback is determined by the requirements imposed in respect of the noise factor, the linearity and the amplification of the differential amplifier stage. For example, the non-linear distortion factor or the magnitude of the so-called intermodulation products IPn, where n=2, 3, 4 . . . , is then taken as a measure of the linearity. These intermodulation products become manifest in the output signal of the differential amplifier stage as interference products and generally occur in the case of transmission of at least two signals of different frequency via a system having a non-linear transfer characteristic, being the differential amplifier stage in the present case, due to so-called cross-modulation. They may have a significant effect on the quality of the signal processed.

The article "A Linearization Technique for Variable Transconductors Using Emitter-Coupled Pairs and Its Application to a 1-Volt Active Filter", published in "Proceedings of ESCCIRC '90", pp. 165 to 168, discloses a circuit arrangement in which linearization of the characteristic of differential amplifier stages of the described kind is achieved by parallel operation of a plurality of individual differential amplifier stages. On the individual differential amplifier stages thereof appropriate input voltage shifts and weights of their "current tails" are imposed. Moreover, the emitter surface areas of the transistors used are chosen according to a predetermined ratio.

FIG. 1 shows a circuit arrangement which is constructed in this manner for the linearization of a non-stabilized feedback differential amplifier stage. In order to simplify the explanation, in comparison with the cited state of the art FIG. 1 shows the circuit arrangement with only two differential amplifier stages i.e. two emitter-coupled transistor pairs. The transistors denoted by the references Q1 and Q2 form a first differential amplifier stage and the transistors denoted by the references Q3 and Q4 form a second differential amplifier stage. The emitter surface areas of the transistors Q1 and Q4 are equal and a predetermined factor larger than the likewise mutually equal emitter surface areas of the transistors Q2 and Q3. The emitters of the transistors Q1, Q2 of the first differential amplifier stage are connected directly to one another and to ground via a first constant current source IO1. Analogously, the transistors Q3, Q4 of the second differential amplifier stage are connected directly to one another and to ground via a second constant current source IO2. The base terminals of the transistors Q1 and Q3 are connected to an input terminal in, the base terminals of the transistors Q2 and Q4 being connected to a second input terminal ini. The collector terminals of the transistors Q1, Q3 are connected together to an output terminal outi and, via a collector resistor R1, to a supply voltage terminal VCC. Analogously, a connection exists between the collector terminals of the transistors Q2, Q4 and a further output terminal out, via a second collector resistor R2 connected to the supply voltage terminal. As opposed to the circuit arrangement described in the cited article, the working impedances of the differential amplifier stages are constructed as resistors R1, R2; however, this does not change the basic operation of the circuit arrangement.

In the circuit arrangement shown in FIG. 1, the zero-crossing of the differential amplifier characteristic has been shifted to more negative input voltages in one of the differential amplifier stages and, to the same extent, to more positive input voltages in the other differential amplifier stage, so that as a result of addition of the two characteristics the differential output voltage is free from DC shifts (offset-free) and linearization of the superposed characteristics takes place. Compensation of the non-linear third-order component in the voltage at the output terminals out, outi is achieved notably for a surface ratio of 4:1 between the emitter surface areas of the transistors Q1, Q4 on the one side and Q2, Q3 on the other side.

Further linearization can be achieved by parallel connection of a plurality of such differential amplifier stages with appropriately selected surface area ratios.

However, it has been found that in the described circuit arrangement, for example, for a compensation of the non-linear third-order component with a surface area ratio of 4:1, the amplification of the overall circuit arrangement is reduced by 3.8 dB, corresponding to a factor of 1.55, in comparison with that of a simple differential amplifier stage. This reduction of the amplification is accompanied by a corresponding increase of the noise factor. Moreover, the relative spread of surface area ratios of emitter surfaces of bipolar transistors in integrated circuits is comparatively high, that is to say higher than, for example in the case of integrated resistors. This leads to manufacturing tolerances which are liable to degrade the achieved linearization.

SUMMARY OF THE INVENTION

It is an object of the invention to provide a circuit arrangement which includes a differential amplifier stage of the kind set forth and enables more reliable linearization of the characteristic with a higher amplification and hence a lower noise factor.

This object is achieved according to the invention in that
the output impedances are preferably constructed as identical voltage dividers provided with a respective tapping for each further differential amplifier stage, the main current paths of the further differential amplifier stages are connected to each time two pair-wise mutually symmetrical tappings, providing a predetermined division, of the two voltage dividers, the ratio of the instantaneous values of the control signals to one another is predetermined, and the division of the tappings of the voltage dividers and the ratio of the currents supplied by the reference current sources are adjusted to one another in such a manner that output signal components which exhibit a dependency on at least one higher power of the control signals cancel out.

In the circuit arrangement according to the invention, preferably the amplifier members of all differential amplifier stages are proportioned so as to correspond at least in respect of their main current paths. Surface area ratios of the transistors to be used which deviate from 1 are thus eliminated. This removes a significant, manufacture-imposed source of errors from the desired linearization.

The invention enables linearization of a non-stabilized feedback differential amplifier stage as well as of a differential amplifier stage with stabilized feedback. In order to achieve such stabilized feedback, the main current paths of the amplifier members of the first differential amplifier stage can be connected to the first reference current source via a respective feedback impedance. The invention is preferably used for the linearization of circuit arrangements with differential amplifier stages in integrated electronic semiconductor components. It is particularly suitable for differential amplifier stages operating with low supply voltages. Therefore, the invention can be used notably for telecommunication apparatus and among such apparatus preferably for battery-powered telecommunication apparatus, for example wireless types.

BRIEF DESCRIPTION OF THE DRAWING

The drawing shows not only the state of the art but also embodiments of circuits so as to illustrate the invention. Thus.

DESCRIPTION OF THE PREFERRED EMBODIMENTS

Figure 1:
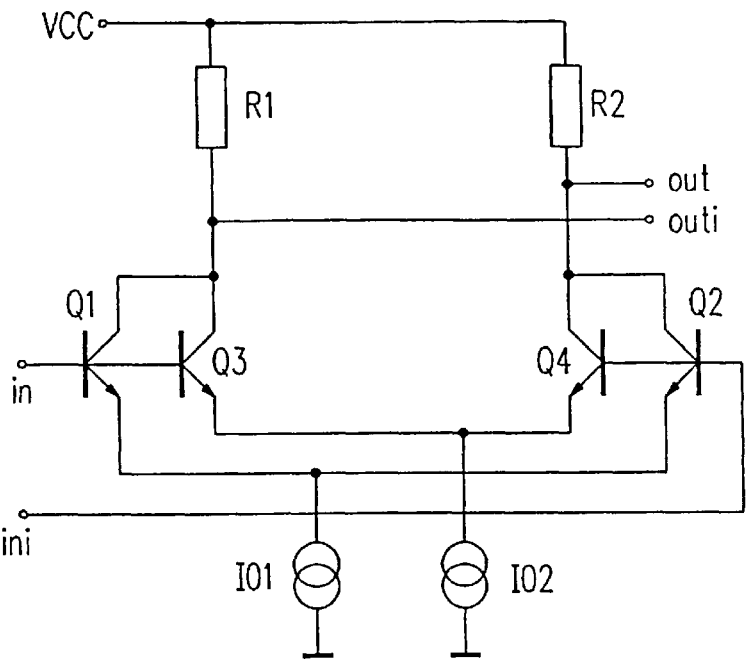
FIG. 1 shows a circuit arrangement which has been explained in conjunction with the presentation of the state of the art.
Figure 2:
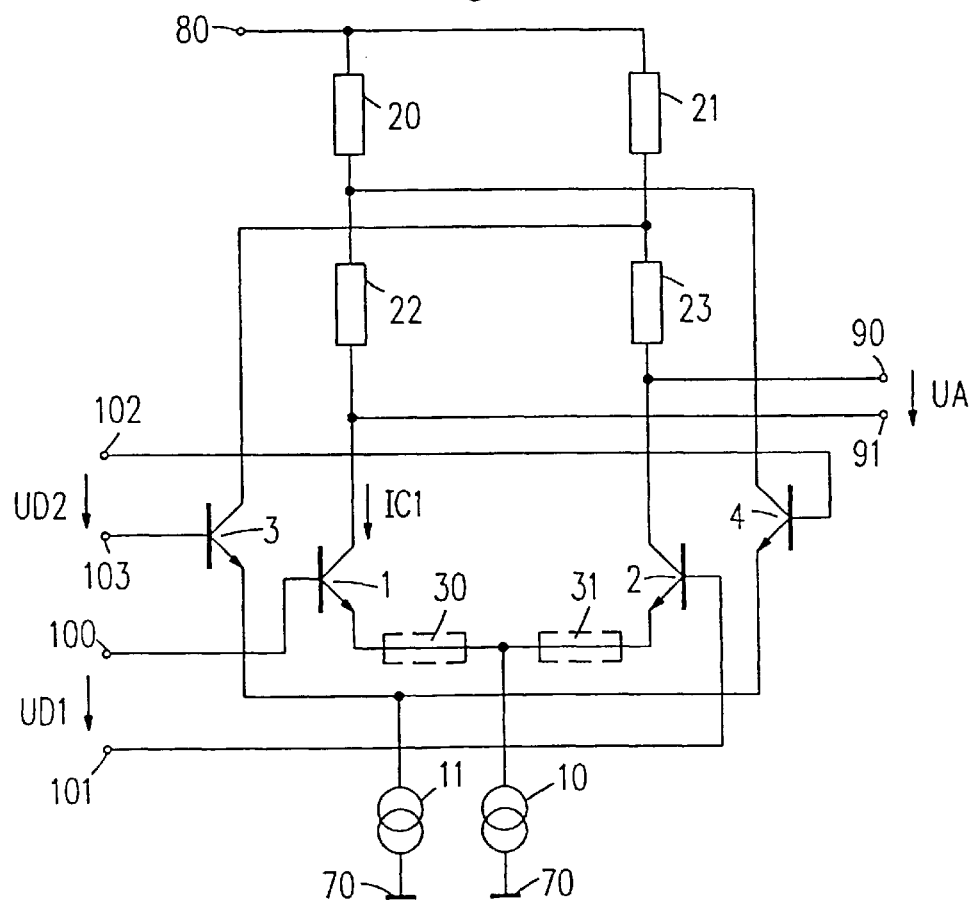
FIG. 2 shows a first embodiment of the invention.

The first embodiment of a circuit arrangement as shown in FIG. 2 includes a first differential stage with a first amplifier member 1 and a second amplifier member 2. Each amplifier element 1, 2 has a main current path between two main current terminals and a respective control terminal. In the embodiment shown in FIG. 2, the amplifier members 1, 2 are constructed as bipolar transistors of the NPN type, their main current terminals being formed by the collector and emitter terminals whereas the control terminals are formed by the base terminals. The main current paths of these NPN transistors are formed by the collector-emitter paths of the NPN transistors. A first main current terminal, being the emitter terminal in the embodiment shown, of the first as well as of the second amplifier element 1, 2 is coupled to a first terminal of a first constant current source 10. A second terminal of the constant current source 10 is connected to a first reference potential which is formed by the ground terminal 70 in FIG. 2. The coupling between the first main current terminals (emitter terminals) of the amplifier members 1, 2 and the first connection of the first constant current source 10 is direct in the case of a non-stabilized feedback differential amplifier stage and via a respective feedback impedance 30, 31 in the case of a stabilized feedback differential amplifier stage. The feedback impedances 30, 31 are generally constructed as ohmic resistances and are, therefore, also referred to as emitter resistors.

The first and the second amplifier member 1, 2 is coupled, to a second reference potential 80 by way of a respective second main current terminal, i.e. by way of the associated collector terminal in the embodiment shown in FIG. 2. This second reference potential 80 is represented by a supply voltage terminal in FIG. 2. The second main current terminals (collector terminals) of the amplifier members 1, 2 also constitute a respective output terminal 90, 91 of the first differential amplifier stage. The control terminals of the amplifier members 1, 2, formed by base terminals of the NPN transistors constituting the amplifier members in FIG. 2, can be supplied with a first control voltage UD1 during operation. The transfer characteristic between this control voltage UD1 and an output voltage UA at the output terminals 90, 91 satisfies a tangent hyperbolic function as described in the article "Halbleiter-Schaltungstechnik", by U. Tietze and Ch. Schenk, 4. Auflage, page 63. This characteristic leads to non-linearities when the driving by the control voltage is sufficiently high, i.e. to higher-harmonic components in the output voltage UA.

In accordance with the invention, the circuit arrangement shown in FIG. 2 is provided with a second differential amplifier stage which includes a third and a fourth amplifier member 3, 4. Each of the third and fourth amplifier members also includes a respective main current path between two main current terminals and a respective control terminal. The third and the fourth amplifier member 3, 4 in FIG. 2 are also constructed as NPN transistors with an emitter terminal and a collector terminal as the first and the second main current terminal, respectively, and a base terminal as the control terminal. A first main current terminal (emitter terminal) of the third as well as the fourth amplifier member 3, 4 is connected to a first terminal of a second constant current source 11. A second terminal of the second constant current source 11 is connected to the first reference potential, i.e. to the ground terminal 70. The control terminals of the third and the fourth amplifier member 3, 4 can be supplied with a second control voltage UD2 during operation. The control terminals of the amplifier members 1 to 4 are connected to input terminals 100, 101, 103 and 102, respectively, for the supply of the control voltages UD1, UD2.

The second main current terminals, i.e. the collector terminals, of the first and the fourth amplifier member 1, 4 on the one side and of the second and the third amplifier member 2, 3 on the other side are coupled, via a respective voltage divider stage, to the second reference potential, i.e. the supply voltage terminal 80. The first voltage divider stage includes two series-connected resistors 20, 22, whereas the second voltage divider stage includes two further, like-wise series-connected resistors 21, 23. Each of the voltage divider stages includes at least one tapping which is connected to a respective one of the second main current terminals (collector terminals) of the third and the fourth amplifier member. The tappings, i.e. the proportioning of the resistors 20, 22 and 21, 23 of the voltage divider stages impose a division ratio. The voltage divider stages are preferably proportioned to be the same so that their division ratios are also the same. Preferably, the amplifier members 1 to 4 also have an analogous construction.

When the voltage divider stages with the resistors 20 to 23, the DC currents supplied by the constant current sources 10, 11 and the ratio of the values of the two control voltages UD1 and UD2 are appropriately chosen, components in the output signal, i.e. in the output voltage UA, which exhibit a dependency on a higher power of the control signals, i.e. of the control voltages UD1, UD2, can cancel out. These are cross-modulation products with components in the case of odd frequency multiples of the control voltages UD1, UD2. Via appropriate proportioning it can be selected which of the harmonics of the control voltage UD1 (or of the control voltage UD2 which is directly proportional to the first control voltage UD1) is to be eliminated from the output voltage UA. Preferably, the third harmonic is compensated, i.e. eliminated from the output voltage UA, since it has the highest amplitude of all harmonics occurring and hence causes the largest disturbance.

For the example concerning, a first non-stabilized feedback differential stage, i.e. a stage without the emitter resistors 30, 31, the transfer characteristic, i.e. the dependency of the currents in the main current paths of the amplifier members 1, 2 on the control voltage UD1, can be used to derive analytically, using series development of the tangent hyperbolic function and solution according to powers of the control voltage UD1 for the compensation of each harmonic, a proportioning rule for the constant current sources 10, 11 and the voltage divider stages 20, 22 or 21, 23, in dependence on the proportionality factor between the control voltages UD1 and UD2. For example, if the third harmonic, i.e. the third-order component, is to be compensated, the proportioning should be in conformity with the following equation:

$$UD1^3 \cdot IO1 \cdot (R1+R3) = UD2^3 \cdot IO2 \cdot R1,$$

where
IO1 is the direct current supplied by the first constant current source 10,
IO2 is the direct current supplied by the second constant current source 11,
R1 is the ohmic resistance of the resistor 20 of the first voltage divider stage, and
R3 is the ohmic resistance of the resistor 22 of the first voltage divider stage.

It is also assumed to hold that the ohmic resistances of the resistors 20, 21 correspond and that the ohmic resistances of the resistors 22 and 23 are equal. The following relation is then obtained for the fundamental component UAg of the output voltage UA:

$$UAg=((UD1 \cdot IO1)/(2UT)) \cdot (R1+R3) \cdot (1-((UD1^2)/(UD2^2)));$$

where UT is the so-called temperature voltage of the semiconductor material of the amplifier members 1 to 4.

When a sufficiently large proportionality factor is chosen between the control voltages UD1 and UD2, the last factor in the above formula can be taken as near to value 1 as possible, so that the amplitude of the fundamental component UAg is reduced as little as possible. The individual elements of the circuit arrangement can be determined on the basis of this requirement and using the first relation, after selection of the DC current of the first constant current source 10 and, for example the sum of the ohmic resistances R1 and R3.

The following values are obtained in a proportioning example:

IO1=100 $\mu$A
IO2=10 $\mu$A
R1=1.852 kohms
R3=3.148 kohms
UD2=3·UD1

The fundamental component UAg is then reduced merely by one dB, i.e. by the factor 1.125. In comparison with the proportioning example that can be derived from the state of the art, the invention thus achieves an increase of the amplitude of the fundamental component UAg by 2.8 dB.

The proportioning of the components of the circuit shown in FIG. 2 is realized similarly for the case of the first differential amplifier stage with stabilized feedback via the emitter resistors 30, 31. The transfer characteristic between the control voltage and the current in the main current path, which has been affected by the feedback impedances (emitter resistors), must then be taken into account; instead of a closed, analytic solution it necessitates a numerical calculation in this case. The latter is based on the characteristic equation $$UD1 = UT \cdot ln((IO1/2+IC1)/(IO1/2-IC1))+2 \cdot R5+IC1$$

for the first differential amplifier stage,
where IC1 is the alternating current in the main current path of the first amplifier element 1, and
R5 is the ohmic resistance of the mutually equal emitter resistors 30, 31.

For iterative proportioning, preferably the ratio of the values of the control voltages UD1, UD2 and the sum of the ohmic resistances R1 and R3 are given. By iterative incrementation of the value for the DC current IO2 of the second constant current source 11 there is found a DC value for which the component of the desired order disappears from the output voltage UA. Subsequently, in conformity with the relation $$IO2/IO1=(R1+R3)/R1,$$

the ratio of the ohmic resistance R1 of the resistors 20, 21 to the sum of the ohmic resistances of the resistors 20 and 22, 21 and 23 can be optimized.

The following values were obtained in a proportioning example:
UD1=UD2
IO1=96 $\mu$A
IO2=14 $\mu$A
R1=1.8 kohms
R3=11 kohms
R5=1.2 kohms.

Figure 3:
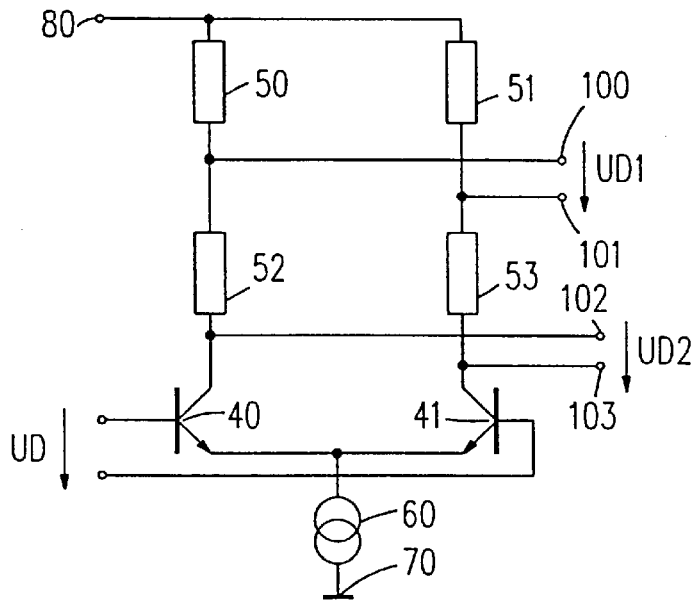
FIG. 3 shows a circuit arrangement for use in conjunction with the first embodiment.

FIG. 3 shows an example of a circuit arrangement which is suitable for deriving a first and a second control voltage UD1, UD2 from a common control voltage UD, said control voltages UD1 and UD2 being proportional with a selectable factor. This circuit arrangement includes a differential amplifier stage with two NPN transistors 40, 41 whose emitter terminals are coupled together, via a constant current source 60, to the ground terminal 70. Between each of the collector terminals of the transistors 40, 41 and the supply voltage terminal 80 there is connected a voltage divider which consists of resistors 50, 52 and 51, 53, respectively. The collector terminals of the transistors 40, 41, moreover, constitute the input terminals 102, 103 of the second differential amplifier stage 3, 4 of the circuit arrangement according to the invention, whereas tappings of the voltage dividers 50, 52 and 51, 53 constitute the input terminals 100 and 101, respectively, of the first differential amplifier stage 1, 2. The ratio of the control voltages UD1 and UD2 can then be simply selected by appropriate proportioning of the voltage dividers 50, 52 and 51, 53.

Figure 4:
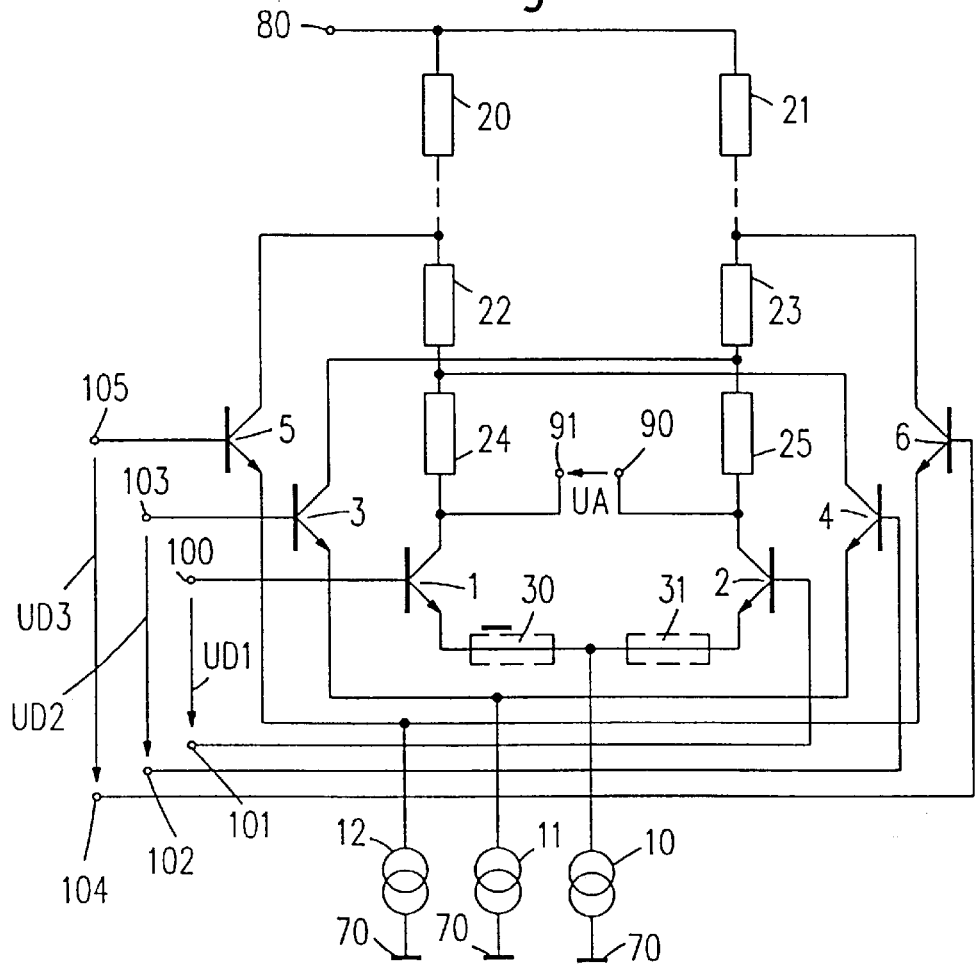
FIG. 4 shows a second embodiment of the invention.

FIG. 4 shows a further embodiment of the circuit arrangement according to the invention, the circuit arrangement of FIG. 2 having been extended so as to compensate more than one higher-order component simultaneously. For the additional compensation a respective further differential amplifier stage is provided for each respective component, and the voltage divider stages comprise a further tapping for each further differential amplifier stage. The first voltage divider stage in FIG. 4 thus includes a further resistor 24 which is inserted between the resistor 22 and the first amplifier member 1, in series with the main current path thereof. An analogously inserted resistor 25 is connected in series with the main current path of the second amplifier member 2 in the second voltage divider stage. The third differential amplifier stage of FIG. 4, consisting of a fifth and a sixth amplifier member 5, 6, which are again constructed as NPN transistors, is connected to the ground terminal 70, like the second differential amplifier stage 3, 4, via a third constant current source 12; the control terminals of the amplifier members 5, 6 constitute further input terminals 104, 105 of the circuit arrangement of FIG. 4. The input terminals 104, 105 receive a third control voltage UD3 which is also proportional to the first control voltage UD1. Dashed connections between the resistors 20 and 22, 21 and 23 of the voltage divider stages indicate that the circuit of FIG. 4 can be extended with further elements in the voltage divider stages and hence with further differential amplifier stages.

For the remainder the circuit arrangement shown in FIG. 4 corresponds to the first embodiment shown in FIG. 2. The proportioning of the individual components is also performed while using the same proportioning rules; because of the additional resistances of the voltage divider stages and the additional constant current sources (possibly further constant current sources for further differential amplifier stages in addition to the third constant current source 12), additional degrees of freedom exist in the relations between the circuit parameters, said degrees of freedom enabling compensation of a corresponding number of higher-order components.

What is claimed is:

1. A circuit arrangement which includes a first differential amplifier stage with two amplifier members whose main current paths on the one hand are coupled to one another and, via a first reference current source, to a first reference potential, and on the other hand are coupled to a respective output terminal as well as, via a respective output impedance, to a second reference potential, and whose control terminals can be supplied with a first control signal, an output signal being available at the output terminals, at least one further differential amplifier stage, each of which includes two further amplifier members whose main current paths on the one hand are coupled to one another and, via a respective further reference current source, to the first reference potential and whose control terminals can be supplied with (a) further control signal(s), characterized in that the output impedances are voltage dividers provided with a respective tapping for each further differential amplifier stage, the main current paths of the further differential amplifier stages are connected respectively to two pairwise mutually symmetrical tappings, providing a predetermined division, of the two voltage dividers, and further comprising means for predetermining the ratio of the instantaneous values of the control signals to one another, and means for adjusting the division of the tappings of the voltage dividers and the ratio of the currents supplied by the reference current sources to one another in such a manner that output signal components which exhibit a dependency on at least one higher power of the control signals cancel out.

2. A circuit arrangement as claimed in claim 1, characterized in that the amplifier members of all differential amplifier stages are proportioned so so that at least their main current paths have an analogous construction.

3. A circuit arrangement as claimed in claim 1, characterized in that the main current paths of the amplifier members of the first differential amplifier stage are connected to the first reference current source via a respective feedback impedance.

4. An integrated electronic semiconductor component, characterized in that it includes a circuit arrangement as claimed in claim 1.

5. A telecommunication apparatus, characterized in that it includes an integrated electronic semiconductor component as claimed in claim 4.

* * * * *